United States Patent
Kawasumi

(10) Patent No.: US 8,111,571 B2
(45) Date of Patent: Feb. 7, 2012

(54) SEMICONDUCTOR MEMORY DEVICE

(75) Inventor: Atsushi Kawasumi, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 226 days.

(21) Appl. No.: 12/643,925

(22) Filed: Dec. 21, 2009

(65) Prior Publication Data

US 2010/0165771 A1    Jul. 1, 2010

(30) Foreign Application Priority Data

Dec. 26, 2008 (JP) ................................ 2008-333972

(51) Int. Cl.
*G11C 7/02* (2006.01)
(52) U.S. Cl. ........................................ 365/207; 365/210
(58) Field of Classification Search .................. 365/207, 365/205, 210, 154
See application file for complete search history.

(56) References Cited

U.S. PATENT DOCUMENTS

| | | | |
|---|---|---|---|
| 5,835,423 A * | 11/1998 | Harima ........................ | 365/194 |
| 6,760,269 B2 * | 7/2004 | Nakase et al. ............. | 365/210.13 |
| 6,806,753 B2 | 10/2004 | Kawasumi | |
| 7,042,776 B2 * | 5/2006 | Canada et al. ............... | 365/194 |
| 7,061,793 B2 * | 6/2006 | Barth et al. .................. | 365/154 |

FOREIGN PATENT DOCUMENTS

JP           09-259589           10/1997

OTHER PUBLICATIONS

T. Saeki et al., "A 2.5-ns Clock Access, 250-MHz, 256-Mb SDRAM with Synchronous Mirror Delay," IEEE Journal of Solid-State Circuits, vol. 31, No. 11, Nov. 1996.
Background Art Information

* cited by examiner

*Primary Examiner* — Anh Phung
(74) *Attorney, Agent, or Firm* — Knobbe, Martens, Olson & Bear LLP

(57) ABSTRACT

A semiconductor memory device comprises a plurality of word lines, a plurality of bit lines intersecting the word lines, a memory cell array having a plurality of memory cell each provided at an intersection of the word line and the bit line, a plurality of sense amplifier each of which detects and amplifies a signal level of the bit line, a replica word line, a replica bit line intersecting the replica word line, a replica memory cell provided at each intersection of the replica word line and the replica bit line, a replica circuit which simulates reading out of the memory cell, and a timing generating circuit which quantizes a replica delay time that is a time until the replica bit line changes from a reference timing, and which generates an activation timing for the sense amplifier based on a quantization result.

20 Claims, 8 Drawing Sheets

SEMICONDUCTOR MEMORY DEVICE

CROSS-REFERENCE TO RELATED APPLICATION

This application is based upon and claims the benefit of priority from the prior Japanese Patent Application No. 2008-333972, filed on Dec. 26, 2008, the entire contents of which are incorporated herein by reference.

BACKGROUND OF THE INVENTION

1. Field of the Invention

The present invention relates to a semiconductor memory device, and more specifically, generation of an activation timing for a sense amplifier.

2. Description of the Related Art

In general semiconductor memory devices, read-out of data is realized as a sense amplifier detects and amplifies a signal level appearing across bit lines in accordance with the data stored in a memory cell, and outputs it externally.

Accordingly, it is effective to shorten a time between selection of a memory cell and activation of the sense amplifier in order to make the operating period of the semiconductor device faster.

If the sense amplifier is made activated fast, however, data prior to appearing of a sufficient signal level across the bit lines is detected and amplified. This becomes a cause of misreading in this case.

As such, there is a technology which utilizes a replica circuit to generate an appropriate activation timing for the sense amplifier (see, for example, JPH09-259589A). The replica circuit has the same structure as that of a memory cell array, simulates a timing of reading out data from a memory cell, and makes the sense circuit activated at that timing.

However, a timing generated by the replica circuit is normally supplied to the sense circuit via several circuits. Accordingly, because of the influence of the delay times caused by such circuits, it is not true that the replica circuit really and sufficiently simulates the memory cell array.

Moreover, although the replica circuit can replicate a change in the characteristics of a memory cell due to temperature change or the like, there is a problem such that the foregoing circuit cannot reflect such a change.

SUMMARY OF THE INVENTION

A semiconductor memory device according to a first aspect of the present invention comprises: a memory cell array including a plurality of word lines, a plurality of bit lines each intersecting the plurality of word lines, and a plurality of memory cells each provided at an intersection of the word line and the bit line; a plurality of sense amplifiers each configured to detect and amplify a signal level of the bit line; a replica circuit including a replica word line, a replica bit line intersecting the replica word line, and a replica memory cell provided at each intersection of the replica word line and the replica bit line, the replica circuit being configured to simulate an read-out operation of the memory cell; and a timing generating circuit configured to quantize a replica delay time which is a time from a reference timing to when the replica bit line starts changing, and to generate an activation timing for the sense amplifier based on a quantization result.

A semiconductor memory device according to a second aspect of the present invention comprises: a memory cell array including a plurality of word lines, a plurality of bit lines each intersecting the plurality of word lines, and a plurality of memory cells each provided at an intersection of the word line and the bit line; a plurality of sense amplifiers each configured to detect and amplify a signal level of the bit line; a replica bit line having a same configuration as the bit line, and configured to simulates a change in a signal of the bit line; and a timing generating circuit configured to quantize a replica delay time which is a time from a timing (reference timing) that the word line is selected to a timing that a signal of the replica bit line changes, and to generate an activation timing for the sense amplifier based on a quantization result.

A semiconductor memory device according to a third aspect of the present invention comprises: a memory cell array including a plurality of word lines, a plurality of bit lines each intersecting the plurality of word lines, and a plurality of memory cells each provided at an intersection of the word line and the bit line; a plurality of sense amplifiers each configured to detect and amplify a signal level of the bit line; a replica bit line having a same configuration as the bit line, and configured to simulate a change in a signal of the bit line; and a timing generating circuit configured to generate an activation timing for the sense amplifier based on a timing of selecting the word line and an operating waveform of the replica bit line, and the timing generating circuit comprising an outward circuit and a homeward circuit each including a plurality of unit circuits (stages) connected in series, the unit circuit having a predetermined delay time, and the outward circuit and homeward circuits being configured to propagate the timing of selecting the word line, and the outward circuit comprising a plurality of gates each connecting each stage of the outward circuit and each stage of the homeward circuit together, and configured to being controlled by a signal of the replica bit line.

DETAILED DESCRIPTION OF THE EMBODIMENTS

An explanation will be given of embodiments of a semiconductor device of the present invention below with reference to accompanying drawings.

First Embodiment

Figure 1:
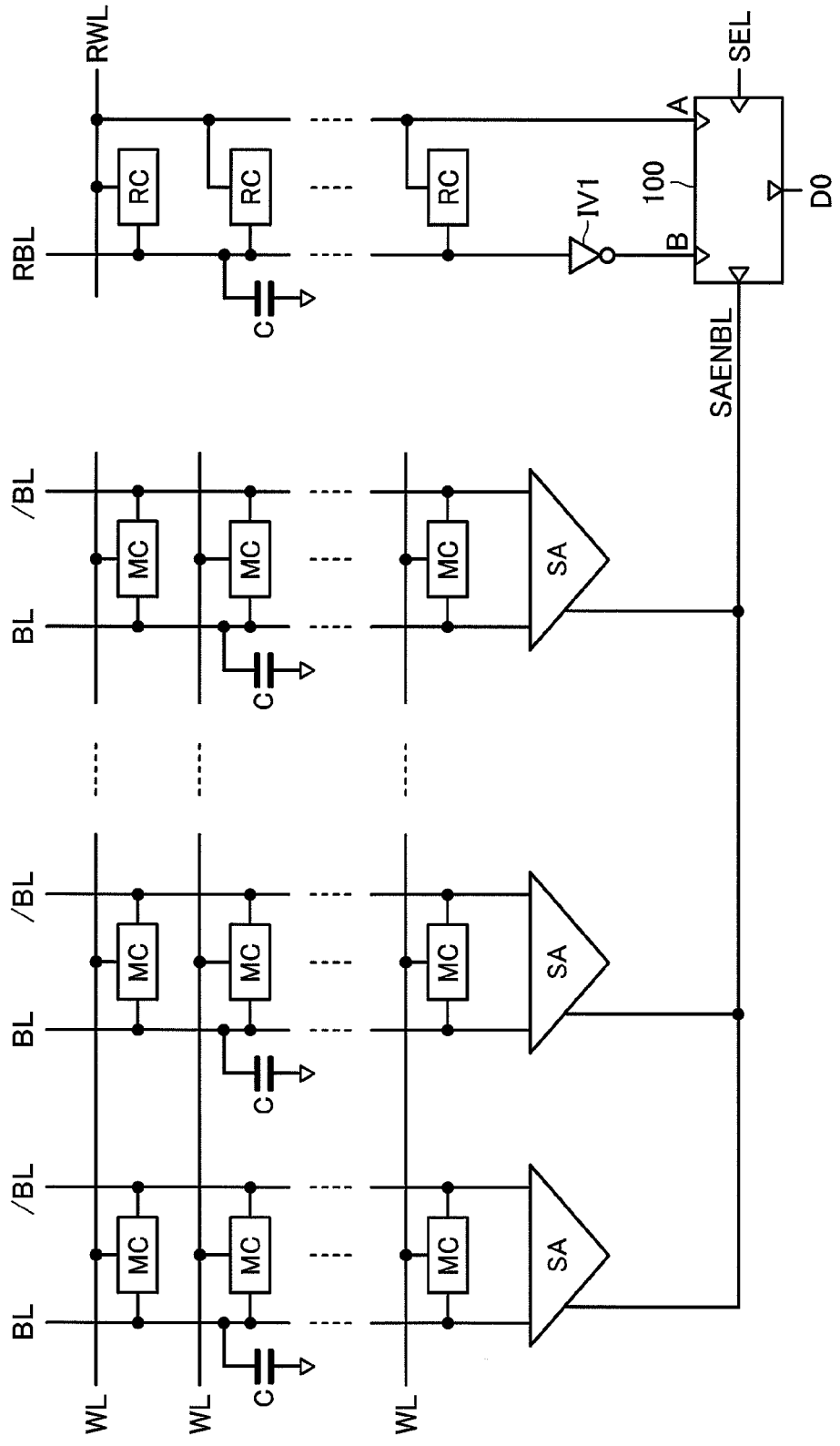
FIG. 1 is a schematic view showing a semiconductor memory device according to a first embodiment of the present invention.

FIG. 1 is a schematic view showing a semiconductor memory device according to the first embodiment of the present invention.

The semiconductor memory device comprises a memory cell array having a plurality of word lines WL, plurality of bit line pairs each intersecting the plurality of word lines and each comprised of a pair of complementary bit lines BL, /BL, and a plurality of memory cells MC each connected to an intersection of the word line WL and the bit line pair. Let us suppose that the parasitic capacitance of each bit line BL is C.

A sense amplifier SA which detects and amplifies a tiny signal appearing across the bit lines BL, /BL is provided at an end terminal of each bit line pair.

Furthermore, the semiconductor memory device has a replica circuit comprising a replica bit line RBL having the same parasitic capacitance C as that of the bit line BL, a replica word line RWL intersecting the replica bit line RBL, and a replica cell RC connected to the replica bit line RBL and the replica word line RWL, and having the same structure as that of the memory cell MC.

An inverter IV1 which detects and amplifies a tiny signal appearing on the replica bit line RBL is connected to an end of the replica bit line RBL of the replica circuit. Moreover, a timing generating circuit 100 having two inputs A and B is also provided. The input A is connected to the replica word line RWL, while the input B is connected to an output terminal of the inverter IV1. A signal input into the input A is referred as a reference signal (reference timing), while a signal input into the input B is referred as a replica delay signal. The timing generating circuit 100 generates a sense amplifier activation signal SAENBL for making the sense amplifier circuit SA activated based on the reference signal and the replica delay signal. In accordance with a selection signal SEL of plural bits given from the exterior, a digital output DO which has a faster timing by what corresponds to a predetermined time than the sense amplifier activation signal SAENBL can be obtained.

Figure 2:
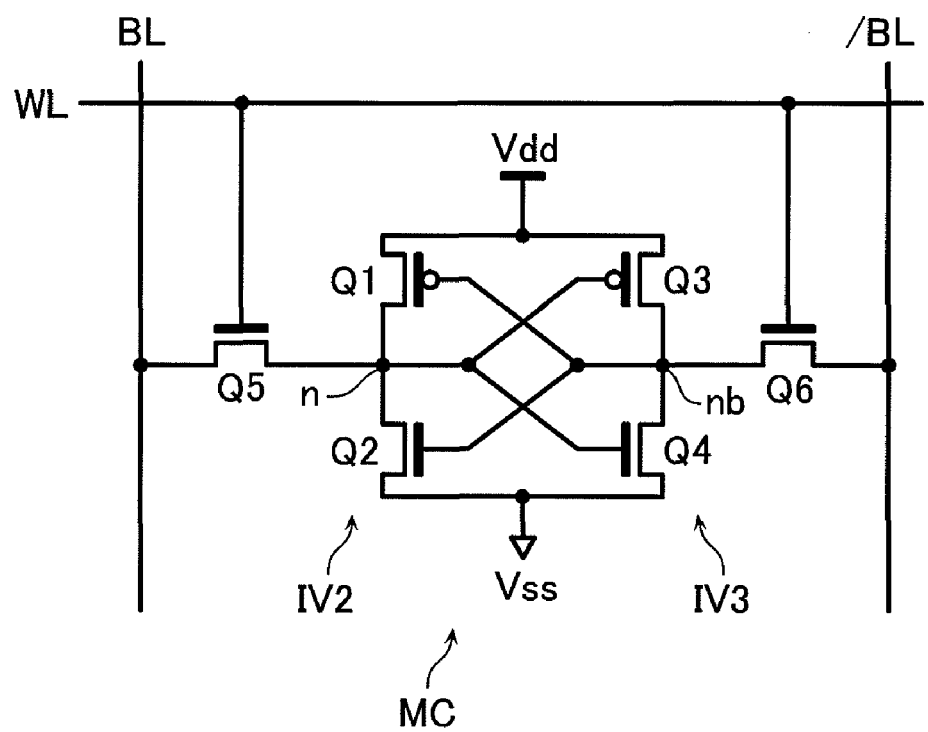
FIG. 2 is a circuit diagram of a memory cell of the semiconductor memory device.

As shown in FIG. 2, the memory cell MC is a six-transistor memory cell. That is, the six-transistor memory cell comprises a second inverter IV2 which has a pair of complementary-connected PMOS transistor Q1 and NMOS transistor Q2 having sources respectively connected to a power-supply line of a power-supply voltage Vdd and a grounding line of a ground voltage Vss. The six-transistor memory cell also comprises a third inverter IV3 which has a pair of complementally-connected PMOS transistor Q3 and NMOS transistor Q4 having sources respectively connected to the power-supply line and the grounding line. The input of the inverter IV2 is connected to the output of the inverter IV3, while the input of the inverter IV3 is connected to the input of the inverter IV2. A transfer transistor Q5 is connected between the bit line BL and the output terminal of the inverter IV2. A transfer transistor Q6 is also connected between the bit line /BL and the output terminal of the inverter IV3. The gates of the transfer transistors Q5, Q6 are connected to the word line WL. Note that write-in operation using the six-transistor memory cell is performed on both bit lines BL and /BL, but read-out operation may be single end read-out operation performed on either one of the bit lines BL or /BL.

In the following explanation, the signal level of the power-supply voltage Vdd is called "H", while the signal level of the ground voltage Vss is called "L" in some cases.

Figure 3:
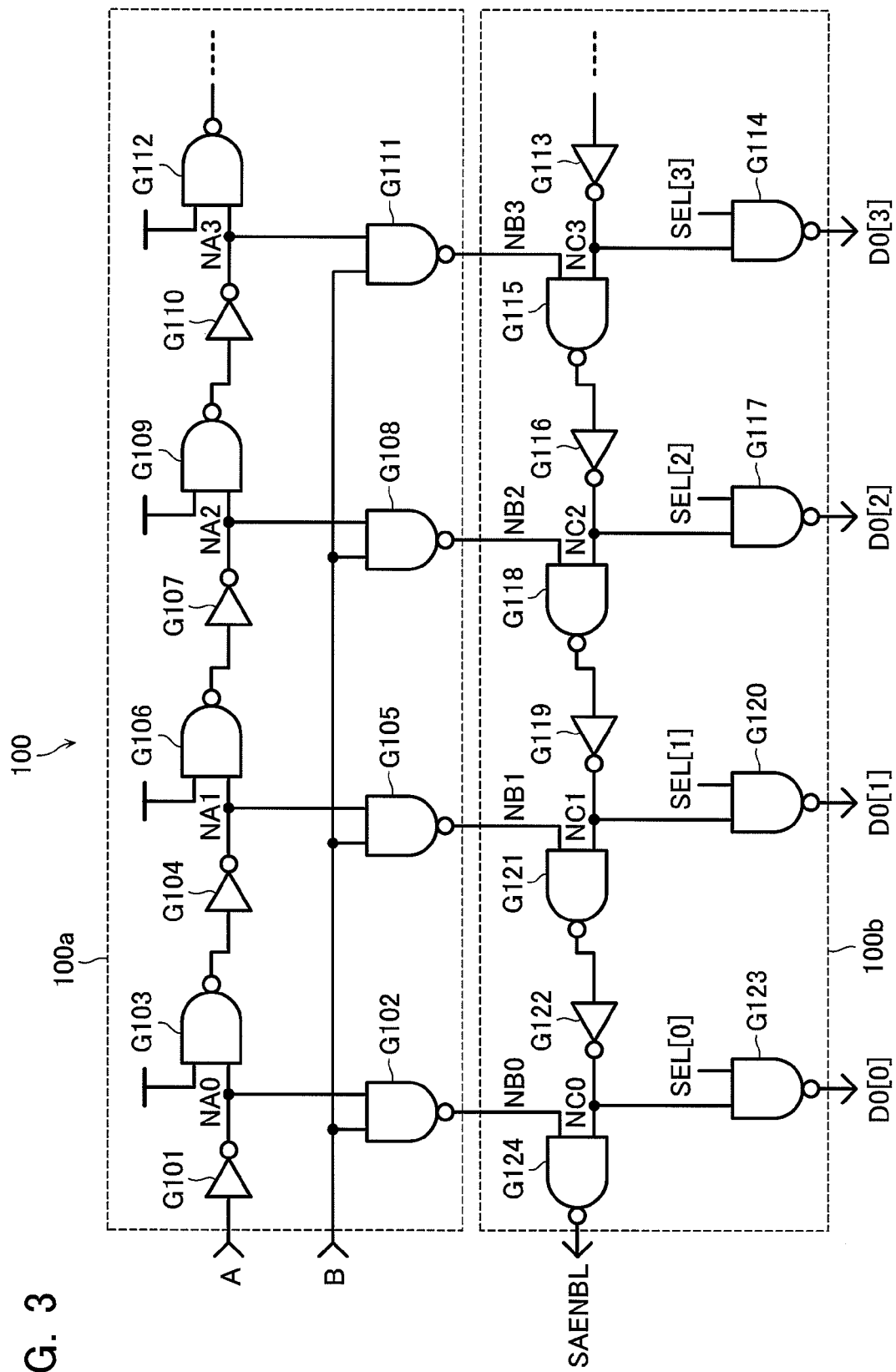
FIG. 3 is a circuit diagram of a timing generating circuit of the semiconductor memory device.

Next, an explanation will be given of the timing generating circuit 100 with reference to FIG. 3.

The timing circuit 100 comprises an outward circuit 100a and a homeward circuit 100b.

The outward circuit 100a has an inverter G101 into which the reference signal is input. Moreover, the outward circuit 100a has a NAND gate G103 which is a first gate having an input terminal connected to an output terminal of the inverter G101, and an inverter G104 which is a second gate having an input terminal connected to an output terminal of the NAND gate G103. A circuit pattern comprising one NAND gate and one inverter is repeated subsequently. Another input terminal of the NAND gate G103, G106, G109, and G112 is set to "H". Hereinafter, output terminals of the inverters G101, G104, G107, G110, and the like are referred as a node NA0, a node NA1, a node NA2, a node NA3, and the like, respectively. A structure between individual nodes NA is called a "stage". That is, in the case of FIG. 3, each stage is comprised of one NAND gate and one inverter. The outward circuit 100a further has NAND gates G102, G105, G108, and G111 having one input terminals connected to the nodes NA0, NA1, NA2, NA3, respectively, and having another input terminals commonly connected to an input B.

The outward circuit 100a quantizes a difference in timings between a rising of the reference signal and a rising of the replica delay signal. The quantization results appear as outputs of respective NAND gates G102, G105, G108, G111, and the like. Hereinafter, outputs of those NAND gates are referred as a node NB0, a node NB1, a node NB2, a node NB3, and the like, respectively.

The homeward circuit 100b has a NAND gate G115 that is a fourth gate into which an output of the inverter G111 is input, and an inverter G116 which is a fifth gate having an input terminal connected to an output terminal of the NAND gate G115. Like the outward circuit 100a, a circuit pattern comprising one inverter and one NAND gate is repeated subsequently. Moreover, the homeward circuit 100b has a NAND gate G124 having one input terminal connected to an output terminal of the inverter G122. An output of the NAND gate G124 serves as the sense amplifier activation signal SAENBL. Another input terminals of the NAND gates G124, G121, G118, G115, and the like are connected to respective output terminals of the NAND gates G102, G105, G108, G111, and the like of the outward circuit 100a. The homeward circuit 100b further has NAND gates G123, G120, G117, G114, and the like which are sixth gates having one input terminals connected to output terminals of respective inverters G122, G119, G116, G113, and the like. Selection signals SEL[0], SEL[1], SEL[2], SEL[3], and the like are input into respective another input terminals of the NAND gates G123, G120, G117, G114, and the like. Outputs of the NAND gates G123, G120, G117, G114, and the like serve as digital outputs D0[0], DO[1], DO[2], DO[3], and the like, respectively. Like the case of the outward circuit 100a, output terminals of the inverters G122, G119, G116, G113, and the like are referred as a node NC0, a node NC1, a node NC2, a node NC3, and the like, respectively. Moreover, a structure between individual nodes NC is referred as a "stage".

The homeward circuit 100b outputs a change in a signal appearing at the node NB as the sense amplifier activation signal SAENBL via the node NC.

Next, an explanation will be given of an operation of the timing generating circuit 100 having the foregoing structure.

Figure 4:
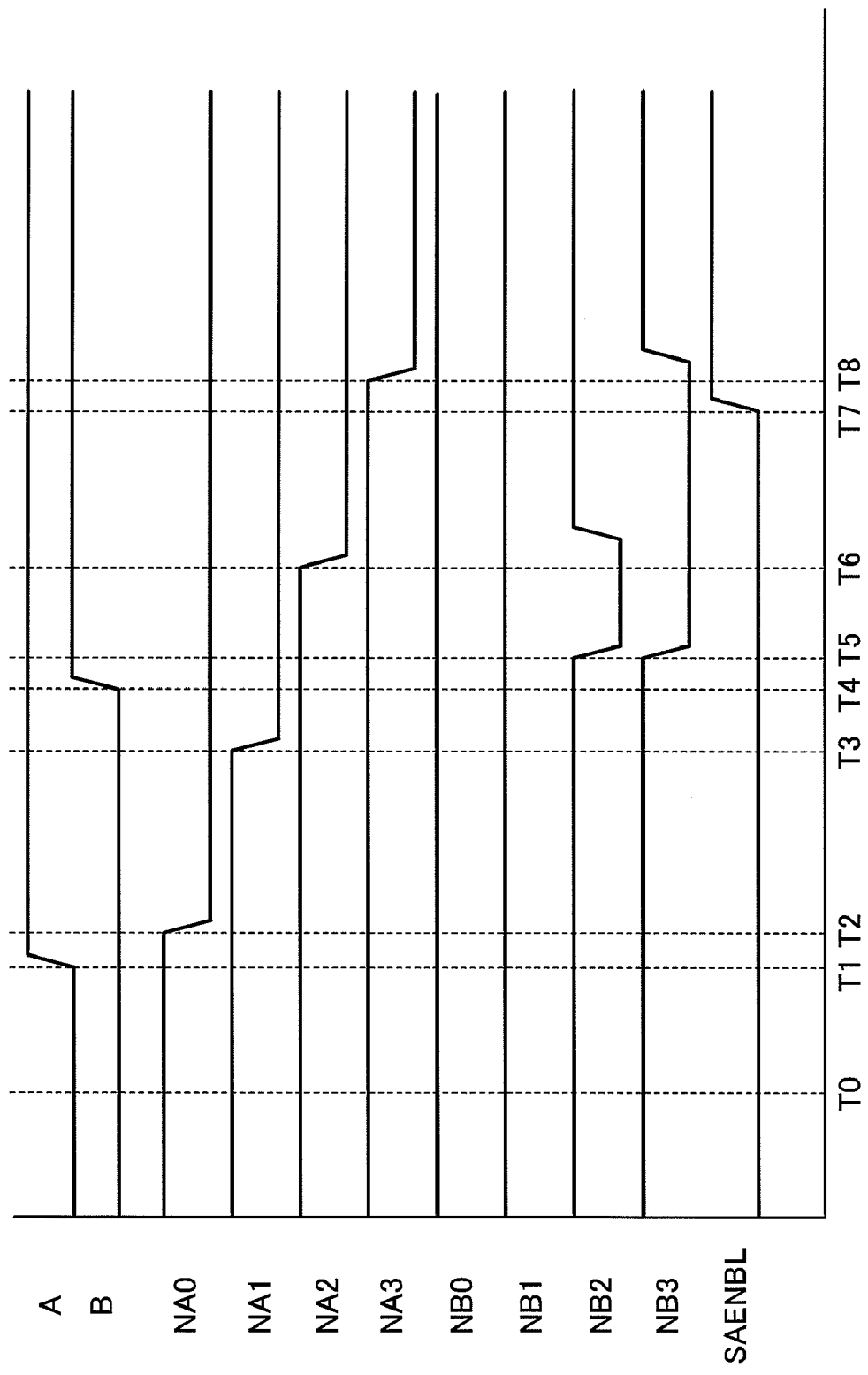
FIG. 4 is a graph showing an operating waveform of the timing generating circuit of the semiconductor memory device.

FIG. 4 shows an operating waveform of the timing generating circuit 100. Prior to reading out of data (at time T0), the replica word line RWL is in a non-selected state like the word line WL. Accordingly, the reference signal input into the input A is "L". In contrast, the replica bit line RBL is pre-charged to "H" like the bit lines BL, /BL. Accordingly, an output of the inverter IV1, i.e., a signal of the input B is "L". Note that nodes NA0, NA1, NA2, NA3, and the like are all "H".

Subsequently, at a time T1, a predetermined word line WL is selected, and the replica word line RWL is also selected. Accordingly, the reference signal becomes "H". In contrast, data of the replica cell RC is input into the replica bit line RBL, so that the signal level of the reference signal gradually decreases to "L".

Next, at a time T2, because of the influence of the reference signal which has risen from "L" to "H" at the time T1, the node NA0 falls down from "H" to "L".

Subsequently, at a time T3, because of the influence of the node NA0 which has risen from "L" to "H" at the time T2, the node NA1 falls down from "H" to "L". A time between the rising of the node NA0 (time T2) to the falling of the node NA1 (time T3) is set based on a delay time caused at the NAND gate G103 and the inverter G104 which configure a stage between the node NA0 and the node NA1. Hereinafter, a delay time for each stage is referred as a "step time".

Next, at a time T6, because of the influence of the node NA1 which has risen from "L" to "H" at the time T3, the node NA2 falls down from "H" to "L". A step time at this time is same as the step time between the node NA0 and the node NA1.

Subsequently, at a time T8, because of the influence of the node NA2 which has risen from "L" to "H" at the time T6, the node NA3 falls down from "H" to "L". A step time at this time is also same as the step time between the node NA0 and the node NA1.

Thereafter, the nodes NA successively fall down from "H" to "L" at individual step times like the times T2, T3, T6, and T8.

Conversely, when the level of the replica bit line RBL which gradually decreases from the time T1 becomes equal to a predetermined threshold of the inverter IV1 or less, an output of the inverter IV3, i.e., the replica delay signal rises from "L" to "H". A time at this occasion is defined as a time T4 between the time T3 when the signal of the node NA1 changes and the time T6 when the signal of the node NA2 changes.

Subsequently, at a time T5, the nodes NA2, NA3 which are not affected by the rising of the reference signal at the time T4 remain to "H", so that the rising of the replica delay signal leads to change of the nodes NB2, NB3 to "L". In other words, the rising of the reference voltage is successively propagated to the nodes NA0, NA1, and the like together with delay times, and at a timing that the replica delay signal rises, the node NB that is an output of the NAND gate having the following node NA to which the rising of the reference voltage is not yet propagated and the replica delay signal as input falls down from "H" to "L". That is, the plurality of nodes NB reflect the results that a time from when the replica word line RWL is selected (rising of the reference signal: time T1) and to when data of the replica cell RC sufficiently appears on the replica bit line RBL (rising of the replica delay signal: time T4) is quantized with a step time.

Subsequently, at a time T7, the sense amplifier activation signal SAENBL rises from "L" to "H".

Note that a delay time from the time T5 to the time T7 is set based on a delay caused at a stage from the node NB2, which is the closest node to the node NC0 between the nodes NB2, NB3 that fall down from "L" to "H", to the node NA0. Because the stage of the homeward circuit 100b is same as that of the outward circuit 100a, a delay which is substantially equal to a time from when the reference signal rises to when the node NA2 falls down is caused. Accordingly, a time from when the reference signal rises to when the sense amplifier activation signal SAENBL starts rising is substantially twice as much as a time from when the reference voltage rises to when the replica delay signal starts rising. In other words, a timing which is substantially twice as much as a time from when the replica word line RWL is selected to when the inverter IV1 detects a tiny signal on the replica bit line RBL is generated.

Note that the NAND gates G123, G120, and the like of the homeward circuit 100b correspond to the NAND gates G102, G105, and the like of the outward circuit 100a. Accordingly, loads driven by the inverters G101, G104, and the like of the outward circuit 100a can be same as loads driven by the inverters G113, G116, and the like of the homeward circuit 100b. Moreover, each bit [0], [1], or the like of the selection signal SEL of the plural bits corresponds to the sense node NC0, NC1, or the like, and for example, if the selection signal SEL[0]="H" is given, it is possible to externally output a signal of the sense node NC0 via the NAND gate G123. That is, because of the presence of the NAND gates G123, G120, and the like, a signal having a faster timing than the activation timing of the sense amplifier activation signal SAENBL can be acquired on a step basis.

An explanation will be given of the activation timing for the sense amplifier SA at the time of reading out data.

First, from the standpoint of the process speed of the semiconductor memory device, the sense amplifier SA should be made activated as fast as possible after the word line WL is selected. However, it takes a certain time until the bit lines BL, /BL which have been pre-charged to "H" fall down to "L". If a capacitance of the bit line BL is C, a current flowing into the memory cell MC is Ic, and a time starting from when the memory cell MC is selected is t, then a potential difference $\Delta V$ between the bit lines BL, /BL is $\Delta V = (Ic/C) \times t$. Accordingly, the larger the time t or the current Ic becomes, the larger a potential difference $\Delta Vbl$ becomes, and the larger the parasitic capacitance C becomes, the smaller a potential difference $\Delta Vbl$ becomes. In practice, when the parasitic capacitance C and the current Ic are set with a presumption that the potential difference $\Delta Vbl$ between the bit lines BL, /BL is 100 mV, the time t becomes 100 ms to 200 ms or so. That is, it is desirable to make the sense amplifier SA activated at this timing. However, because the parasitic capacitance C and the current Ic change depending on a change in the environment like a temperature, it is necessary to adjust the time t in accordance with such a change.

Thus, a replica circuit is generally used. In this case, because the memory cell array and the replica circuit are under the same environment, if the sense amplifier activation signal is made activated at a timing detected on the basis of a signal of the replica bit line RBL, the sense amplifier SA is expected to be made activated at the most appropriate timing in accordance with a change in the environment.

However, because driving force which causes the replica bit line RBL to fall down to "L" is small with merely one replica cell RC, the process becomes slow if the sense amplifier SA is made activated after a sufficient signal level appears on the replica bit line RBL. Thus, in general, a plurality of replica cells are selected simultaneously. A time until the replica bit line RBL is caused to fall down to "L" is shorten in accordance with the simultaneous selection, so that the sense amplifier is made activated with a timing being delayed by a gate of the inverter or the like.

If the number of replica cells RC is n, then a time until a potential difference $\Delta V$ from the power-supply voltage Vdd is generated at the replica bit line RBL is $t = (C \times \Delta V)/(n \times Ic)$. In order to generate an activation timing with such a time being doubled for example, it is necessary to adjust a time td caused by a gate of the inverter or the like to be comparable with $(C \times \Delta V)/(n \times Ic)$.

However, the time td is a value which is independent from a change in the characteristics of the memory cell array. Accordingly, a technique of adjusting a timing using a gate of the inverter or the like cannot reflect a change in the characteristics of the memory cell array.

In this point, according to the embodiment, the time until a potential difference $\Delta Vbl$ from the power-supply voltage Vdd appears at the replica bit line RBL, i.e., a time from the rising of the reference voltage to the rising of the replica delay signal is quantized by the outward circuit 100a, and a delay almost equal to that time is caused by the gate of the homeward circuit 100b. Therefore, it is possible to generate an activation timing for the sense amplifier SA in accordance with a change in the characteristics of the memory cell array.

Next, an explanation will be given of an effect of the timing generating circuit 100 of the semiconductor memory device.

Figure 5:
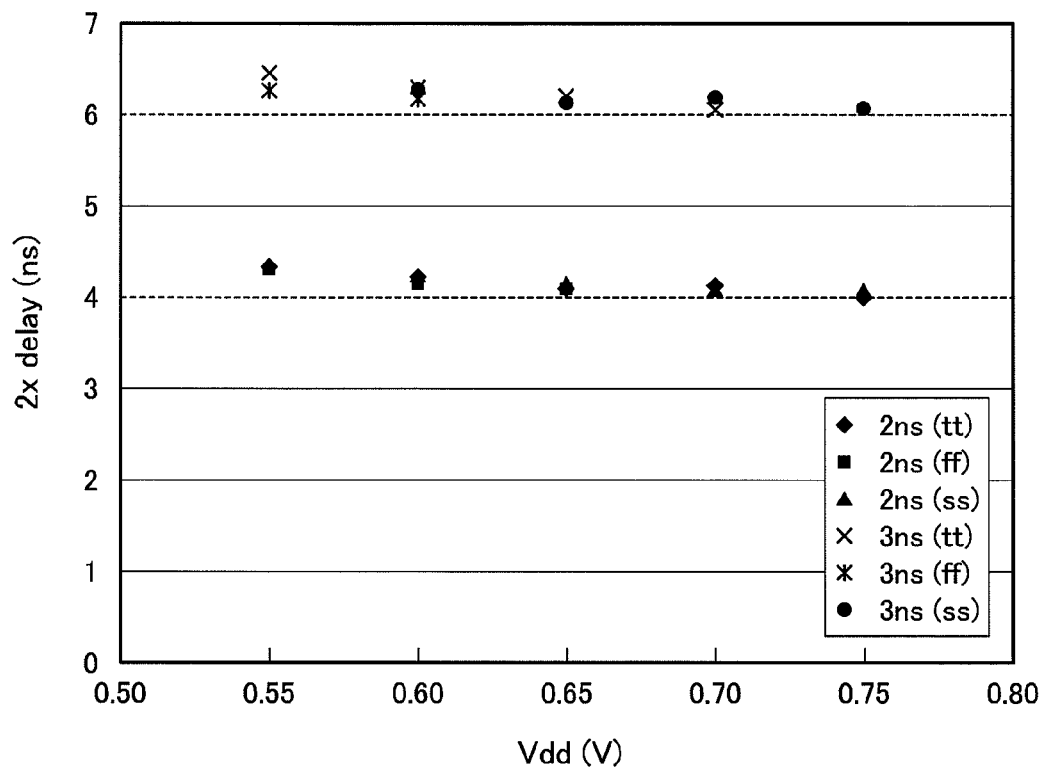
FIG. 5 is a graph showing a simulation result with respect to the timing generating circuit of the semiconductor memory device.

FIG. 5 is a simulation result showing a relationship between times from the rising of the reference signal to the rising of the sense amplifier activation signal relative to the power-supply voltage Vdd.

Regarding a simulation condition, a time from the rising of the reference signal to the rising of the replica delay signal (hereinafter, "replica delay time") is set to 2 ns and 3 ns, and the process conditions of the PMOS transistor and the NMOS transistor are both set to Typical ("tt" in the figure), Fast ("ff" in the figure), and Slow ("ss" in the figure).

As is clear from FIG. 5, when the replica delay time is 2 ns, a delay time of 4 ns (indicated by a dotted line in the figure) which is substantially twice as much as 2 ns is acquired regardless of the conditions of the transistors and the power-supply voltage Vdd. When the replica delay time is 3 ns, it is clear from the figure that a delay time of 6 ns which is substantially twice as much as 3 ns is acquired regardless of the conditions of the transistors and the power-supply voltage Vdd.

Figure 6:
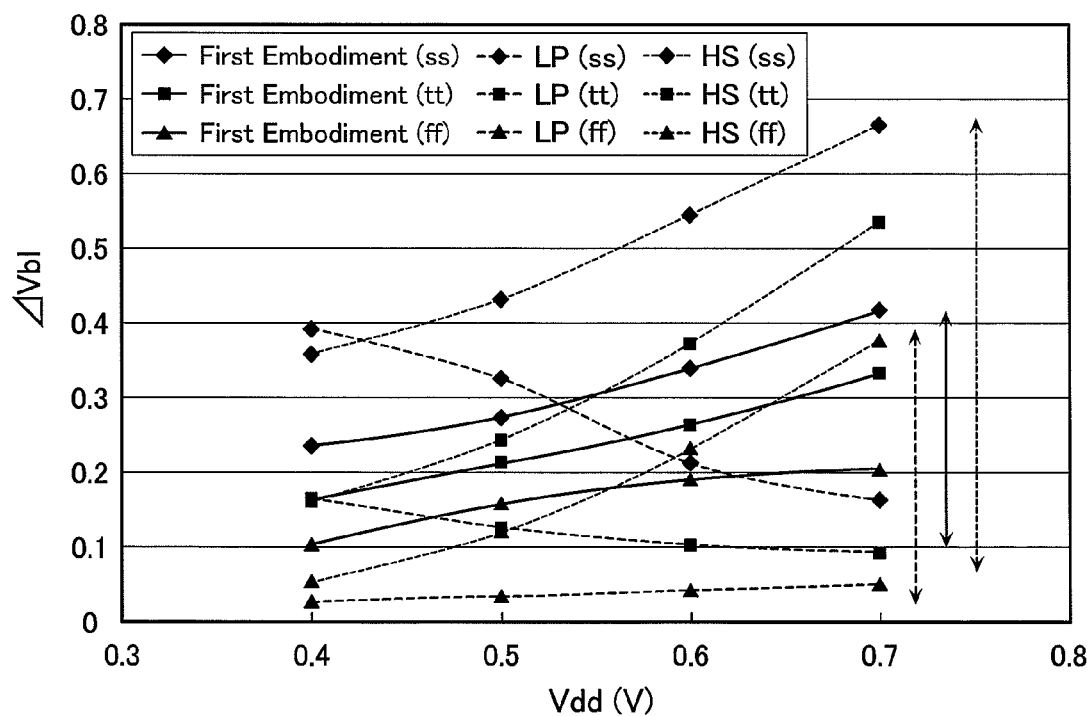
FIG. 6 is a graph showing a simulation result with respect to the semiconductor memory device and a comparative example.

FIG. 6 is a simulation result showing a relationship between the power-supply voltage Vdd and a potential difference $\Delta Vbl$ across the bit line pair.

As a comparative example, a simulation result with respect to a delay circuit comprised of an inverter is also shown in the figure. Note that "LP" is a simulation result of a case in which the inverter is comprised of transistors for a low-voltage process, and "HS" is a simulation result of a case in which the inverter is comprised of transistors for a high-speed process regarding the delay circuit.

The purpose of having the timing generating circuit 100 or the delay circuit of the comparative example is to make the sense amplifier activated at a timing that the potential difference $\Delta Vbl$ between the bit lines BL, /BL becomes the most appropriate value. In this point, it is desirable that the potential difference $\Delta Vbl$ must be constant regardless of the conditions of the transistors and the power-supply voltage Vdd.

In the case of the "HS" delay circuit of the comparative example, a change in the potential difference $\Delta Vbl$ due to a change in the power-supply voltage Vdd is large. For example, in a case in which the process conditions of the transistors are "ff", when Vdd=0.4 V, $\Delta Vbl$=0.06 V or so, and when Vdd=0.7 V, $\Delta Vbl$=0.38 V or so. That is, the difference between those $\Delta Vbl$ is 0.32 V or so. Moreover, a change in the potential difference $\Delta Vbl$ due to a change in the process conditions of the transistors is large. For example, when the power-supply voltage Vdd=0.4 V, the difference between two $\Delta Vbl$ in the "ss" process condition and in the "ff" process condition is 0.32 V or so. As a result, a difference between the minimum $\Delta Vbl$ (Vdd=0.4 V and process condition is "ff") and the maximum $\Delta Vbl$ (Vdd=0.7 V and the process condition is "ss") becomes 0.6 V or so.

In contrast, the "LP" delay circuit of the comparative example has a good result in comparison with the "HS" delay circuit. Even if the process condition having the largest difference in $\Delta Vbl$ when the power-supply voltage Vdd changes from 0.4 V to 0.7 V is "ss", the difference of $\Delta Vbl$ is 0.23 V or so. However, a change in the $\Delta Vbl$ due to a change in the process condition becomes poor in comparison with the "HS" delay circuit depending on the power-supply voltage Vdd. More specifically, when the power-supply voltage Vdd=0.4 V, the difference in $\Delta Vbl$ between the "ss" process condition and the "ff" process condition is 0.37 V or so. As a result, the difference between the minimum $\Delta Vbl$ (Vdd=0.4 V and the process condition is "ff") and the maximum $\Delta Vbl$ (Vdd=0.4 V and the process condition is "ff") becomes 0.37 V or so.

In this point, according to the embodiment, in comparison with the delay circuit of the comparative example, it is clear that a difference in the potential difference $\Delta Vbl$ between the bit lines BL, /BL due to change in the power-supply voltage Vdd and in the process condition is small. For example, even if "ss" is the process condition which has the largest difference of a change in $\Delta Vbl$ when the power-supply voltage Vdd changes from 0.4 V to 0.7 V, such a difference is merely 0.18 V. Moreover, even in the case in which the power-supply voltage Vdd=0.7 V that the difference of a change in $\Delta Vbl$ when the process condition changes becomes largest, such a difference is suppressed to 0.22 V or so. As a result, a difference between the minimum $\Delta Vbl$ (Vdd=0.4 V and the process condition is "ff") and the maximum $\Delta Vbl$ (Vdd=0.7 V and the process condition is "ss") is 0.32 V or so.

Figure 7:
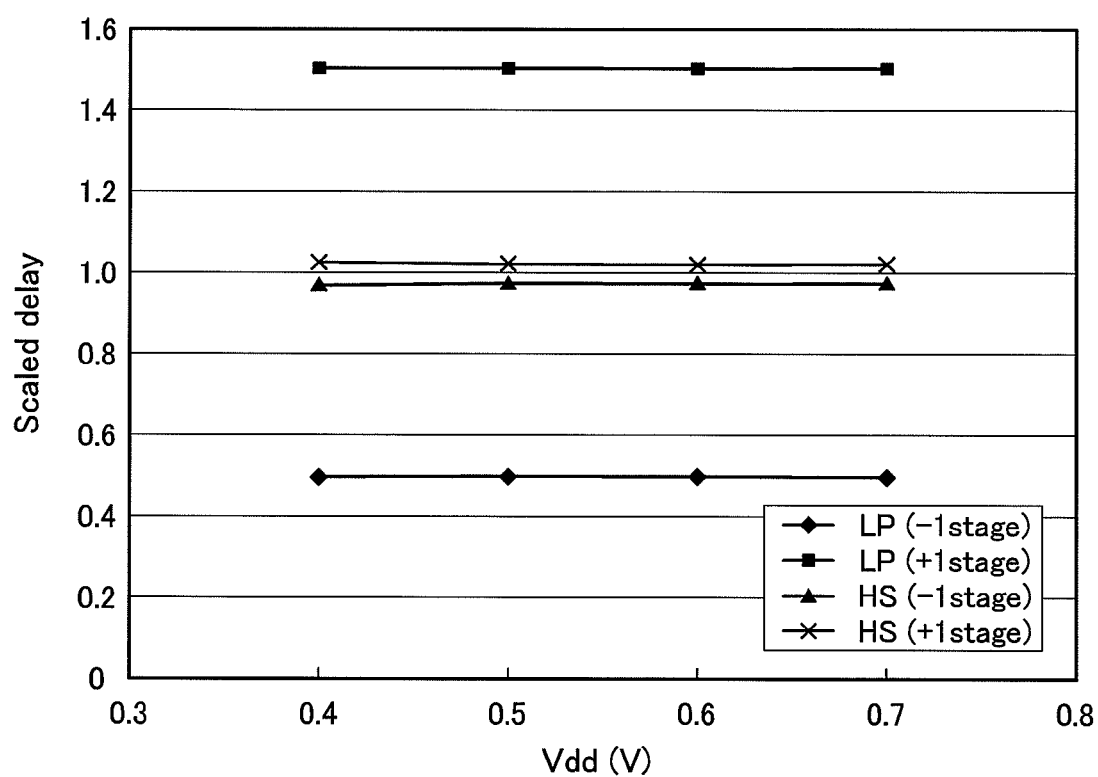
FIG. 7 is a graph showing a simulation result with respect to the timing generating circuit of the semiconductor memory device.

FIG. 7 is a simulation result showing a relationship between the power-supply voltage Vdd and an increase/decrease rate of a delay time due to increment/decrement of the number of steps for a case in which the timing generating circuit 100 comprises transistors for a high-speed process and for a case in which the timing generating circuit 100 comprises transistors for a low-voltage process.

When it is desirable to break up the step time for quantization of the replica delay time by the outward circuit 100a, the timing generating circuit 100 should comprise transistors for a high-speed process which have a small threshold and have a small delay to be caused. However, as is clear from the result in FIG. 6, the high-speed-process transistors have a disadvantage that those are vulnerable to a change in the power-supply voltage Vdd. In this point, as is clear from FIG. 7, according to the embodiment, the outward circuit 100a quantizes the replica delay time, and a time equivalent to the quantized time is given to the homeward circuit 100b. Therefore, the step time for quantization varies in accordance with a change in the power-supply voltage Vdd, but a change rate of a delay time due to increment/decrement of the number of steps remains substantially constant. This indicates that the stability relative to a change in the power-supply voltage Vdd is high regardless of a high-speed process or a low-voltage process.

As explained above, according to the embodiment, influence in accordance with a change in the characteristics of the memory cell array to the replica circuit is directly reflected to generate the sense amplifier activation signal, so that it is possible to make the sense amplifier activated most appropriately in accordance with a change in the environment like a change in the power-supply voltage.

Moreover, the timing generating circuit 100 of the embodiment has the stable characteristics no matter what kind of condition the transistors are for. Therefore, according to the embodiment, influence due to variability among manufacturing processes is little, and it is possible to flexibly cope with a design change or the like.

Second Embodiment

Figure 8:
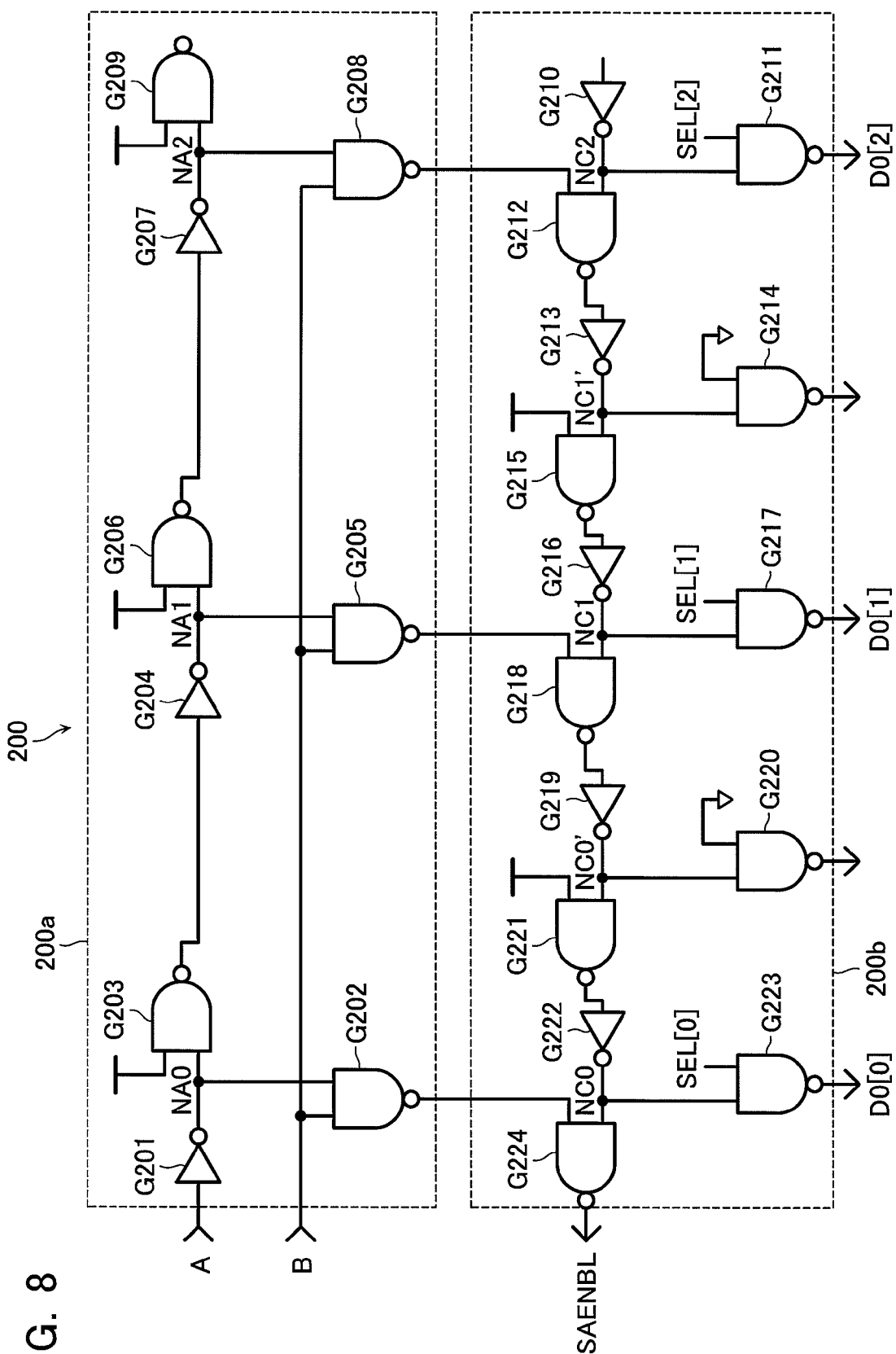
FIG. 8 is circuit diagram of a timing generating circuit of a semiconductor memory device according to a second embodiment of the present invention.

FIG. 8 shows a timing generating circuit 200 of a semiconductor memory device according to the second embodiment of the present invention.

The timing generating circuit 200 triples the replica delay time.

Like the timing generating circuit 100 of the first embodiment, an outward circuit 200a has, for each stage, one NAND gate (G203 or the like) which is a first gate, and one inverter (G204 or the like) which is a second gate.

In contrast, a homeward circuit 200b has, in a case between a node NC0 and a node NC1 for example, for each step, a NAND gate G218 which is a fourth gate connected in a cascade connection manner, an inverter G219 which is a fifth gate, a NAND gate G221 which is a sixth gate, an inverter G222 which is a seventh gate, and a NAND gate G223 that is an eighth gate having one input terminal into which an output of the inverter G222 is input, and another input terminal into which a selection signal SEL[0] is input. In other words, one stage of the outward circuit 200a is configured between the node NC0 and a node NC0' which is an output terminal of the inverter G219, and between the node NC0' and a node NC1. That is, a step time of the homeward circuit 200b is twice as much as that of the outward circuit 200a.

As a result, it is possible to generate a sense amplifier activation signal SAENBL which is substantially three times as much as the replica delay time.

Like the second embodiment, by changing a ratio of the number of gates between the outward circuit and the homeward circuit for each stage, it becomes possible to generate a sense amplifier activation signal which makes the sense amplifier activated at an arbitrary timing.

Third Embodiment

Figure 9:
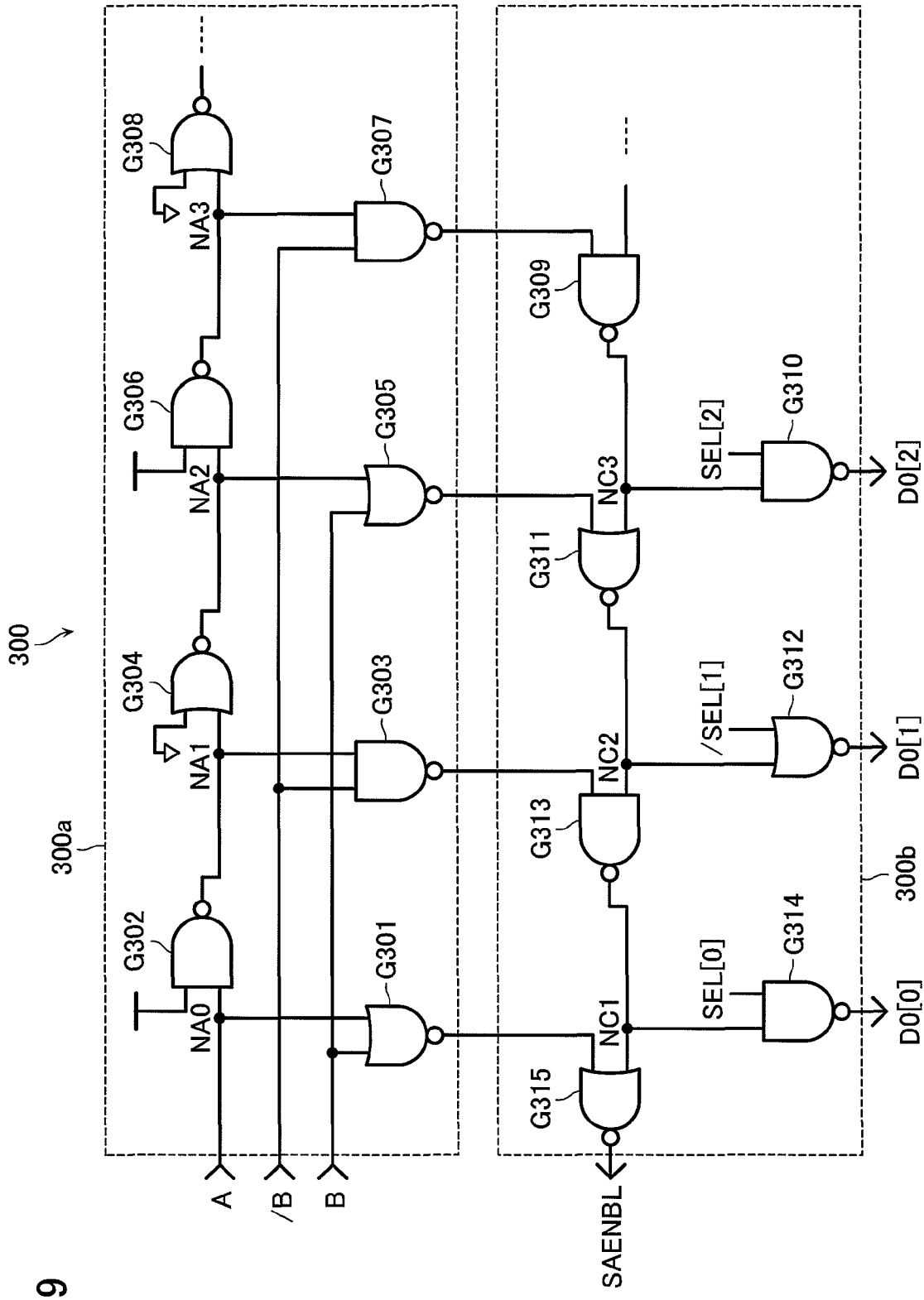
FIG. 9 is a circuit diagram of a timing generating circuit of a semiconductor memory device according to a third embodiment of the present invention.

FIG. 9 is a circuit diagram showing a timing generating circuit 300 of a semiconductor memory device according to the third embodiment of the present invention.

The timing generating circuit 300 is for a case in which it is desirable to reduce a step time.

In order to reduce the step time, the number of gates for each stage in an outward circuit 300a and a homeward circuit 300b should be reduced.

According to the timing generating circuit 300, in comparison with the foregoing timing generating circuits 100, 200, the number of inverters provided for each stage is reduced.

The outward circuit 300a of the timing generating circuit 300 comprises plural first and second stages having mutually-different logics and alternately connected in a cascade connection manner. A first stage has a NAND gate (G302 or the like) that is a first gate into which the reference signal or an output by a previous second stage is input, and a NAND gate (G303 or the like) that is a second gate having an input of the first stage as a first input. A second stage has a NOR gate (G304 or the like) that is a third gate into which an input by the previous first stage is input, and a NOR gate (G305 or the like) that is a fourth gate having an input of the second stage as a first input. In this case, because logics at a node NAi (i=even number) that is an input terminal of the first stage and at a node NAi+1 that is an input terminal of the second stage are inverted, the replica delay signal is input to second input terminals of respective NOR gates G301, G305, and the like having first input terminals respectively connected to a node NA0, a node NA2, and the like. A signal with an inverted logic of the replica delay signal is input into second input terminals of respective NAND gates G303, G307, and the like having first input terminals respectively connected to a node NA1, a node NA3, and the like.

In contrast, the homeward circuit 300b of the timing generating circuit 300 comprises plural third and fourth stages having mutually-different logics and alternately connected in a cascade connection manner. A third stage has a NAND gate (G313 or the like) that is a fifth gate into which an output of the previous second stage and an output of the NAND gate (G303 or the like) that is the second gate of the first stage are input, and a NAND gate (G314 or the like) having an output of the NAND gate (G313 or the like) and a positive-logic selection signal SEL as input. A fourth stage has a NOR gate (G311 or the like) that is a six gate into which an output of the previous stage and an output of the NOR gate (G305) that is the fourth gate of the second stage are input, and a NOR gate (G312 or the like) that is an eighth gate having an output of the NOR gate (G311 or the like) and a negative-logic selection signal /SEL as input.

As explained above, according to the third embodiment, in comparison with the first and second embodiments, it is possible to reduce a step time, so that an error in quantization of the replica delay signal becomes small, thus enabling generation of a further appropriate activation timing for the sense amplifier SA.

Other Embodiment

Although the explanation has been given of cases in which the present invention is applied to an SRAM, the present invention is not limited to the SRAM, and can be applied to all kinds of semiconductor memory devices, such as a DRAM, and a flash memory.

What is claimed is:

1. A semiconductor memory device comprising:
a memory cell array comprising a plurality of word lines, a plurality of bit lines across the plurality of word lines, and a plurality of memory cells at intersections of the word lines and the bit lines;
a plurality of sense amplifiers configured to detect signal levels of the bit lines and to amplify the signal levels of the bit lines;
a replica circuit comprising a replica word line, a replica bit line intersecting the replica word line, and a replica memory cell at an intersection of the replica word line and the replica bit line, the replica circuit being configured to simulate a read-out operation of the memory cell; and
a timing generator configured to quantize a replica delay time from a reference time to when a signal level of the replica bit line changes, and to generate an activation time for the sense amplifier based on a quantization result.

2. The semiconductor memory device of claim 1, wherein the timing generator comprises an outward circuit comprising a plurality of stage circuits connected together, stage circuits comprising a predetermined number of gates, and
the timing generator is configured to compare between a time that the reference time is propagated through the plurality of stage circuits and a time when the signal level of the replica bit line changes, and to quantize the replica delay time based on delay times for stage circuits.

3. The semiconductor memory device of claim 2, wherein the timing generator further comprises a homeward circuit comprising plural stage circuits, and
the timing generator is configured to adjust an activation time for the sense amplifier based on delay times for stage circuits based on a quantization result by the outward circuit.

4. The semiconductor memory device of claim 2, wherein the number of gates in the stage circuit of the outward circuit and the number of gates in the stage circuit of the homeward circuit are same.

5. The semiconductor memory device of claim 2, wherein the number of gates in the stage circuit of the outward circuit and the number of gates in the stage circuit of the homeward circuit are different.

6. The semiconductor memory device of claim 1, wherein the timing generating circuit comprises:
an outward circuit comprising a plurality of first stage circuits comprising first and second gates configured to receive the reference time, the first and second gates being connected in a cascade manner, and a third gate comprising a first input terminal configured to receive an output of the second gate, and a second input terminal configured to receive a time when the signal level of the replica bit line changes, the plurality of first stage circuits being connected in a cascade manner; and
an inward circuit comprising a plurality of second stage circuits comprising fourth and fifth gates connected in a cascade manner, the plurality of second stage circuits being connected in a cascade manner in association with the first stage circuits, the fourth gate comprising a first input terminal configured to receive an output of the third gate and a second input terminal configured to receive an output of a previous second stage circuit, and the inward circuit being configured to generate an activation time for the sense amplifier based on a change in an output of the last second stage circuit.

7. The semiconductor memory device of claim 6, wherein the inward circuit further comprises a sixth gate comprising a first input terminal configured to receive an output of the fifth stage and a second input terminal configured to receive a selection signal for each stage, the selection signal is configured to be used for controlling whether the fifth gate is configured to send an output signal to an exterior of the timing generator.

8. The semiconductor memory device of claim 1, wherein the timing generator comprises:
an outward circuit comprising a plurality of first stage circuits comprising first and second gates configured to receive the reference time, the first and second gates being connected in a cascade manner, and a third gate comprising a first input terminal configured to receive an output of the second gate, and a second input terminal configured to receive a time when the signal level of the replica bit line changes, the plurality of first stage circuits being connected in a cascade manner; and
an inward circuit comprising a plurality of second stage circuits comprising fourth to seventh gates connected in a cascade manner, the plurality of second stage circuits being connected in a cascade manner in association with the first stage circuits, the fourth gate comprising a first input terminal configured to receive an output of the third gate and a second input terminal configured to receive an output of a previous second stage circuit, and the inward circuit being configured to generate an activation time for the sense amplifier based on a change in an output of the last second stage circuit.

9. The semiconductor memory device of claim 8, wherein the inward circuit further comprises an eighth gate comprising a first input terminal configured to receive an output of the seventh gate and a second input terminal configured to receive a selection signal for each stage, the selection signal configured to be used for controlling whether the seventh gate is configured to send an output signal to an exterior of the timing generator.

10. The semiconductor memory device of claim 1, wherein the timing generator comprises:
an outward circuit comprising a plurality of first and second stage circuits alternately connected in a cascade manner, the first stage circuit comprising a first gate configured to receive the reference time, and a second gate comprising a first input terminal configured to receive an output of the first gate, and a second input terminal configured to receive a time when the signal level of the replica bit line changes, the second stage circuit comprising a third gate configured to receive an output of the first stage circuit, and a fourth gate comprising a first input terminal configured to receive an output of the third gate, and a second input terminal configured to receive a signal logically inverted with regards to the time when the signal level of the replica bit line changes; and
an inward circuit comprising a plurality of third and fourth stage circuits alternately connected in a cascade manner in association with the first and second stage circuits, the third stage circuit comprising a fifth gate corresponding to the first gate, the fourth stage circuit comprising a sixth gate corresponding to the third gate, the fifth gate comprising a first input terminal configured to receive an output of the second gate and a second input terminal configured to receive an output of a previous fourth stage circuit, the sixth gate comprising a first input terminal configured to receive an output of the fourth gate, and a second input terminal configured to receive an output of a previous third stage circuit, and the timing generator being configured to generate an activation time for the sense amplifier based on a change in an output of the last fourth stage circuit.

11. The semiconductor memory device of claim 10, wherein the inward circuit further comprises a seventh gate comprising a first input terminal configured to receive an output of the fifth gate and a second input terminal configured to receive a selection signal, the selection signal configured to be used for controlling whether the fifth gate is configured to send an output signal to an exterior of the timing generator for each third stage, and the inward circuit further comprising an eighth gate comprising a first input terminal configured to receive an output of the sixth gate and a second input terminal configured to receive the selection signal for each fourth stage.

12. A semiconductor memory device comprising:
a memory cell array comprising a plurality of word lines, a plurality of bit lines intersecting the plurality of word lines, and a plurality of memory cells at intersections of the word lines and the bit lines;
a plurality of sense amplifiers configured to detect signal levels of the bit lines and to amplify the signal levels of the bit lines;
a replica bit line comprising a same configuration as the bit line, and configured to simulate a change in a signal of the bit line; and
a timing generator configured to quantize a replica delay time from a reference time when the word line is selected to a time when a signal level of the replica bit line changes, and to generate an activation time for the sense amplifier based on a quantization result.

13. The semiconductor memory device according to claim 12, wherein
the timing generator comprises an outward circuit comprising a plurality of stage circuits connected together, stage circuits comprising a predetermined number of gates, and
the timing generator is configured to compare between a time that the reference time is propagated through the plurality of stage circuits and a time when the signal level of the replica bit line changes, and to quantize the replica delay time based on delay times for stage circuits.

14. The semiconductor memory device of claim 12, wherein the timing generator comprises:
an outward circuit comprising a plurality of first stage circuits comprising first and second gates configured to receive the reference time, the first and second gates being connected in a cascade manner, and a third gate comprising a first input terminal configured to receive an output of the second gate and a second input terminal configured to receive a time when the signal level of the replica bit line changes, the plurality of first stage circuits being connected in a cascade manner; and
an inward circuit comprising a plurality of second stage circuits comprising fourth and fifth gates connected in a cascade manner, the plurality of second stage circuits being connected in a cascade manner in association with the first stage circuits, the fourth gate comprising a first input terminal configured to receive an output of the third gate and a second input terminal configured to receive an output of a previous second stage circuit, and the inward circuit being configured to generate an activation time for the sense amplifier based on a change in an output of the last second stage circuit.

15. The semiconductor memory device of claim 12, wherein the timing generator comprises:
an outward circuit comprising a plurality of first stage circuits comprising first and second gates configured to receive the reference time, the first and second gates being connected in a cascade manner, and a third gate comprising a first input terminal configured to receive an output of the second gate and a second input terminal configured to receive a time when the signal level of the replica bit line changes, the plurality of first stage circuits being connected in a cascade manner; and
an inward circuit comprising a plurality of second stage circuits comprising fourth to seventh gates connected in a cascade manner, the plurality of second stage circuits being connected in a cascade manner in association with the first stage circuits, the fourth gate comprising a first input terminal configured to receive an output of the third gate, and a second input terminal configured to receive an output of a previous second stage circuit, and the inward circuit being configured to generate an activation time for the sense amplifier based on a change in an output of the last second stage circuit.

16. The semiconductor memory device of claim 12, wherein the timing generator comprises:
an outward circuit comprising a plurality of first and second stage circuits alternately connected in a cascade manner, the first stage circuit comprising a first gate configured to receive the reference time, and a second gate comprising a first input terminal configured to receive an output of the first gate, and a second input terminal configured to receive a time when the signal level of the replica bit line changes, the second stage circuit comprising a third gate configured to receive an output of the first stage circuit, and a fourth gate comprising a first input terminal configured to receive an output of the third gate and a second input terminal configured to receive a signal logically inverted with regards to the time when the signal level of the replica bit line changes; and
an inward circuit comprising a plurality of third and fourth stage circuits alternately connected in a cascade manner in association with the first and second stage circuits, the third stage circuit comprising a fifth gate corresponding to the first gate, the fourth stage circuit comprising a sixth gate corresponding to the third gate, the fifth gate comprising a first input terminal configured to receive an output of the second gate and a second input terminal configured to receive an output of a previous fourth stage circuit, the sixth gate comprising a first input terminal configured to receive an output of the fourth gate, and a second input terminal configured to receive an output of a previous third stage circuit, and the timing generator being configured to generate an activation time for the sense amplifier based on a change in an output of the last fourth stage circuit.

17. A semiconductor memory device comprising:
a memory cell array comprising a plurality of word lines, a plurality of bit lines intersecting the plurality of word lines, and a plurality of memory cells at intersections of the word lines and the bit lines;
a plurality of sense amplifiers configured to detect signal levels of the bit lines and to amplify the signal levels of the bit lines;
a replica bit line comprising a same configuration as the bit line, and configured to simulate a change in a signal of the bit line; and
a timing generator configured to generate an activation time for the sense amplifier based on a time when the word line is selected and a waveform of the replica bit line, and
the timing generator comprising an outward circuit and an inward circuit comprising a plurality of stage circuits connected in series, the stage circuits comprising a predetermined delay time, and the outward circuit and the inward circuit being configured to propagate the time when the word line was selected, and
the outward circuit comprising a plurality of gates connecting the outward circuit and the homeward circuit of each stage together, and configured to be controlled by a signal of the replica bit line.

18. The semiconductor memory device of claim 17, wherein each stage comprises a predetermined number of gates connected in a cascade manner.

19. The semiconductor memory device of claim 18, wherein the number of gates in the stage of the outward circuit and the number of gates in the stage of the homeward circuit are same.

20. The semiconductor memory device of claim 18, wherein the number of gates in the stage of the outward circuit and the number of gates in the stage of the homeward circuit are different.

* * * * *